(12) United States Patent
Magnavacca et al.

(10) Patent No.: US 6,950,324 B2
(45) Date of Patent: Sep. 27, 2005

(54) MEMORY DEVICE COMPOSED OF A PLURALITY OF MEMORY CHIPS IN A SINGLE PACKAGE

(75) Inventors: Alessandro Magnavacca, Sesto San Giovanni (IT); Andrea Bellini, Gorgonzola (IT); Francesco Mastroiani, Milan (IT); Marco Defendi, Sulbiate (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 21 days.

(21) Appl. No.: 10/727,150

(22) Filed: Dec. 3, 2003

(65) Prior Publication Data

US 2004/0136218 A1 Jul. 15, 2004

(30) Foreign Application Priority Data

Dec. 4, 2002 (IT) .................................. VA2002 A 0067

(51) Int. Cl.$^7$ ................................................ G11C 5/06
(52) U.S. Cl. ........................................... 365/51; 365/63
(58) Field of Search .............................. 356/51; 365/63, 365/185.11, 230.03

(56) References Cited

U.S. PATENT DOCUMENTS 5,524,231 A * 6/1996 Brown ........................ 711/101
6,768,660 B2 * 7/2004 Kong et al. ..................... 365/51

* cited by examiner

Primary Examiner—Tan T. Nguyen
(74) Attorney, Agent, or Firm—Lisa K. Jorgenson; Allen, Dyer, Doppelt, Milbrath & Gilchrist, P.A.

(57) ABSTRACT

The memory device includes a plurality of memory chips of a certain capacity assembled in a single package and sharing input/output pins, the memories being selectable and singularly enabled one at the time by appropriate external commands coherently with the currently addressed memory location. The device uses only one external enable/disable logic command applied through a single dedicated pin. Each of the memory chips has a number of additional input/output pads equal to 2*n, where $2^n$ is the number of memory chips contained in the device, and a dedicated circuit that generates an internal enable/disable command, as a function of logic inputs corresponding to the logic states of the additional pads and the external enable/disable command.

13 Claims, 4 Drawing Sheets

MEMORY DEVICE COMPOSED OF A PLURALITY OF MEMORY CHIPS IN A SINGLE PACKAGE

FIELD OF THE INVENTION

This invention relates in general to memory devices, and, more particularly, to a memory device of a relatively large size comprising a plurality of memory chips each of a certain size, assembled in a single package with an array of input/output pins shared by the different memory chips, which may be singularly enabled by respective external commands.

BACKGROUND OF THE INVENTION

To realize a high density memory device, for example of 128 Mbit, a possible approach includes assembling a plurality of memories (chips) of a certain size inside a single package, for example two memory chips of 64 Mbit each. The so obtained memory has a storage size equal to the sum of the sizes of the single memory chips. The advantage of this approach is that it is not necessary to re-design a new integrated device.

This approach is largely used by manufacturers of memory devices. For sake of simplicity, the assembling of a twin stacked memory is described. The so-called "twin stacked" memory is realized by assembling two memory chips or memories, generally identical, in a single package, bonding together the connection lines to the input/output pins of each memory in common on the array of input/output pins of the mounting frame of the package. According to known practice, the external enabling commands (commonly called chip enable or CE_N) are applied through distinct pins for commanding separately the two memories.

FIG. 1 depicts a classic structure of a "twin stacked" device. The bus of external addresses APD and DQPAD and the control signals OE_N, WE_N, RP_N are connected in common for constituting the equivalent array of input/output pins of the device. By contrast, the CE_N pins are multiple, that is each one is dedicated to a respective memory, and depending on the configuration of logic signals applied to them, four different combinations are possible, that may be selected by the user through dedicated external commands. The user may select one or the other of the two memories by lowering the respective logic "chip enable" command (CE), or place both memories in stand-by by forcing both "chip enable" commands to a high logic level.

There is a risk of both commands accidentally switching low, thus activating in parallel both memories. In any case, the system must manage a plurality of "chip enable" commands specific for the distinct memory chips contained in the packaged device.

SUMMARY OF THE INVENTION

An object of the present invention is to provide a method of managing a plurality of enable commands to respective memory chips for selecting the memory to which a certain read, delete or write command pertains, that is more effective and reliable.

The invention includes the use of a single external chip enable command that is applied through a single pin of the multi-chip device, thus rendering the stacked memory device perfectly similar, from the user's point of view, to a normal "stand alone" memory of capacity equal to the sum of capacities of the distinct memory chips that are included in the packaged device.

This ideal situation that practically eliminates the risk of accidentally activating more than one memory chip at the time is made possible by realizing, on each memory chip, $2*n$ additional input/output pads, wherein n is such that $2^n$ is the number of distinct memory chips that compose the stacked memory device, and a circuit for generating internally an enable/disable command of the memory chip. This circuit comprises $2*n$ buffers, each coupled to a respective additional pad, and a combinatory logic circuit, input with the output signals of the buffers corresponding to the logic state of the additional pads and with the single external enable signal, that generates the internal enable/disable command of the memory chip.

In practice, one or a plurality (n) of the additional I/O pads of each memory chip are hardwired to a certain logic state for example either grounded (GND) or connected to the supply rail (VDD), in different combinations for the distinct memory chips, to distinguish the different memory chips, while the other additional pad or (n) pads are connected to the input/output pin or pins corresponding to the most significant bit or bits of the bus of external addresses.

The combinatory logic generates an enable/disable signal of the coded memory as a function of the biasing of the additional hardwired pad or pads, of the most significant bit or bits of the external address and of the logic value of the single external enable command:

by switching high the external enable signal, all memory chips will be configured in stand-by;

by switching low the external enable signal, only one memory chip among all the memory chips assembled in the same device will be enabled, depending on the logic configuration of these additional pads.

In practice, the user sees only a "stand alone" memory device of a capacity corresponding to the sum of the storage capacities of the memories composing it, and has to manage only a single enable/disable command.

DETAILED DESCRIPTION OF THE PREFERRED EMBODIMENTS

Figure 1:
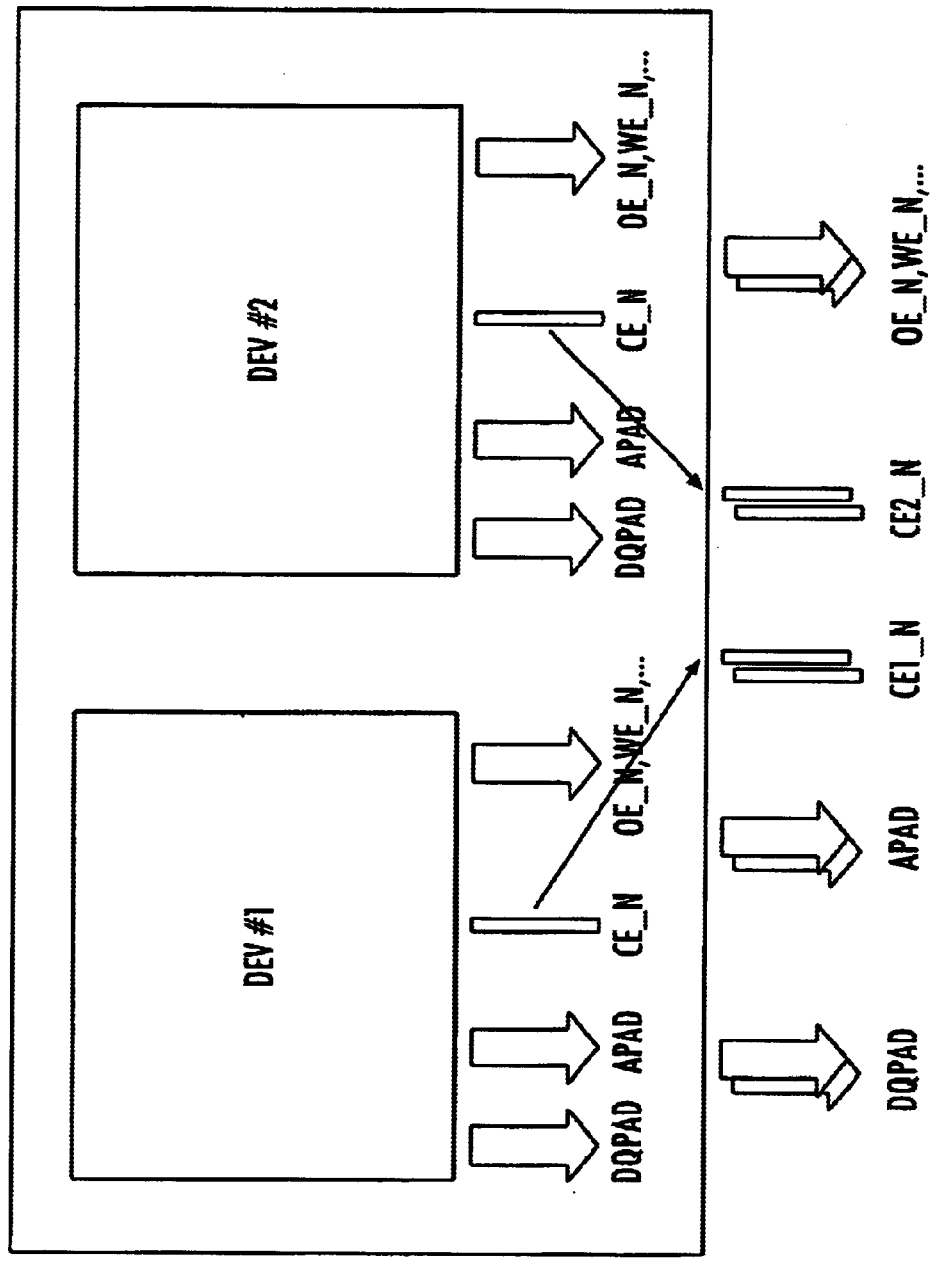
FIG. 1 is a schematic diagram of a conventional twin stacked device.
Figure 2:
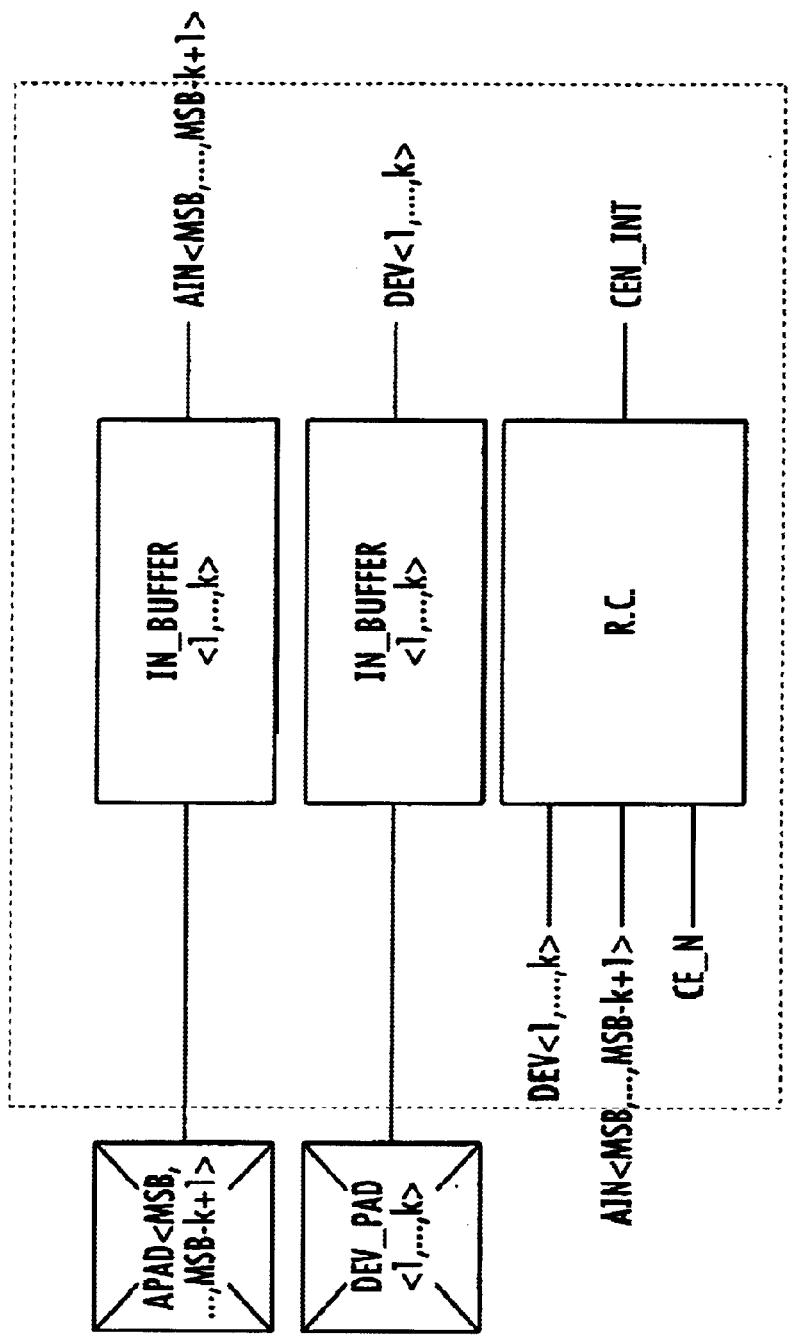
FIG. 2 is a schematic diagram illustrating each memory chip and the additional circuits according to the present invention.

Referring to FIG. 2, according to this invention, in each of the two memory chips DEV#1 and DEV#2 to be mounted inside a single package for realizing a memory device of doubled storage capacity, two additional pads are realized, APAD<MSB> and DEV_PAD, structurally equivalent to the other input/output pads that are usually present. Respective input buffers IN_BUFFER are functionally coupled to the two additional pads and a combinatory logic circuit R.C. is input with the outputs AIN<MSB> and DEV of the two input buffers and with the external enable command CE_N and outputs an internally generated command CEN_INT for enabling/disabling the memory chip.

Figure 3:
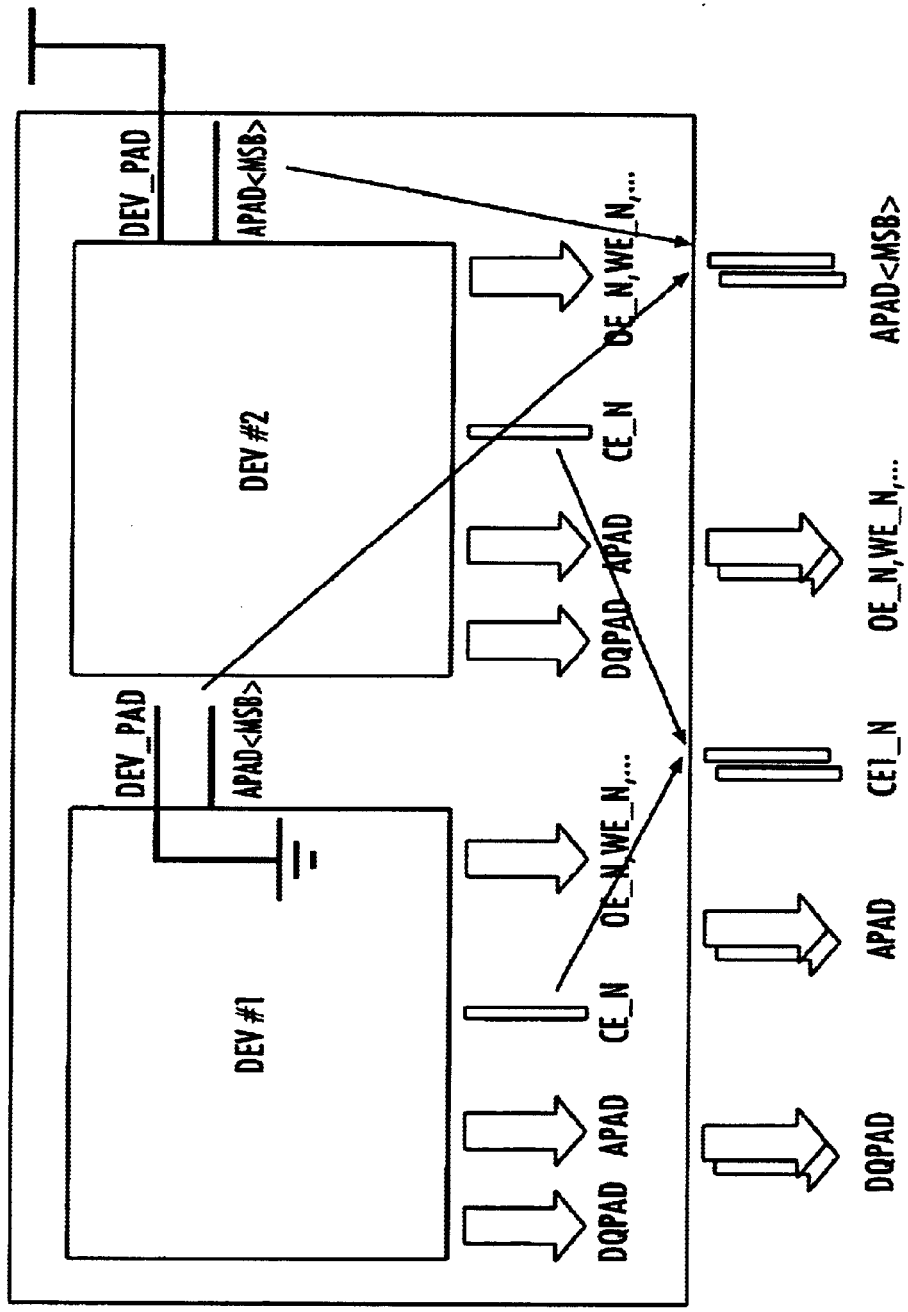
FIG. 3 is a schematic diagram illustrating a twin stacked device according to the present invention.

FIG. 3 depicts a twin stacked device realized according to this invention. The additional pad DEV_PAD of the first memory DEV#1 is grounded while the second pad DEV_PAD of the second memory DEV#2 is connected to the supply voltage node, thus logically distinguishing the two memory chips. The most significant bit of the external address bus (that is added in doubling the capacity of the device, for instance from 64 Mbit to 128 Mbit) is used for selecting one or the other of the two memory chips, rendered logically distinguishable by the different biasing of their additional pad DEV_PAD.

To this end, the additional pads APAD<MSB> of the two memory chips DEV#1 and DEV#2 are connected in common to the corresponding external pin APAD<MSB> of the device. This connection is represented by the two arrows oriented towards the input/output pin corresponding to the most significant bit APAD<MSB> of the external address bus of the device (for sake of simplicity isolatedly shown in FIG. 2).

The pads CE_N of the two memories DEV#1 and DEV#2 dedicated to receive the enable/disable command, are connected in common to the unique input pin (CE_N) of the composite memory device dedicated to receive the external enable/disable command. The logic combinatory logic circuit R.C., realized in each of the two memory chips DEV#1 and DEV#2, generates the internal enable/disable command CEN_INT according to the following exemplary truth table of the logic states of the two additional pads DEV_PAD and APAD<MSB> and of the external unique command CE_N.

|       | CEN_N | DEV_PAD | APAD<MSB> | CEN_INT |
|-------|-------|---------|-----------|---------|
| DEV#1 | 0     | 0       | 0         | 0 (active) |
|       | 0     | 0       | 1         | 1 (standby) |
| DEV#2 | 0     | 1       | 0         | 1 (standby) |
|       | 0     | 1       | 1         | 0 (active) |
|       | 1     | —       | —         | 1 (standby) |

It may be noted that by switching high the logic value of the unique external command CE_N, a stand-by condition of both memory chips is implemented and thus of the composite device as a whole. By switching low the external command CE_N, the device appears to the user as behaving as a "stand alone" memory of capacity equivalent to the sum of the capacities of the two memories contained therein. In fact, depending on the logic value of APAD<MSB> only one of the two memories is enabled.

Figure 4:
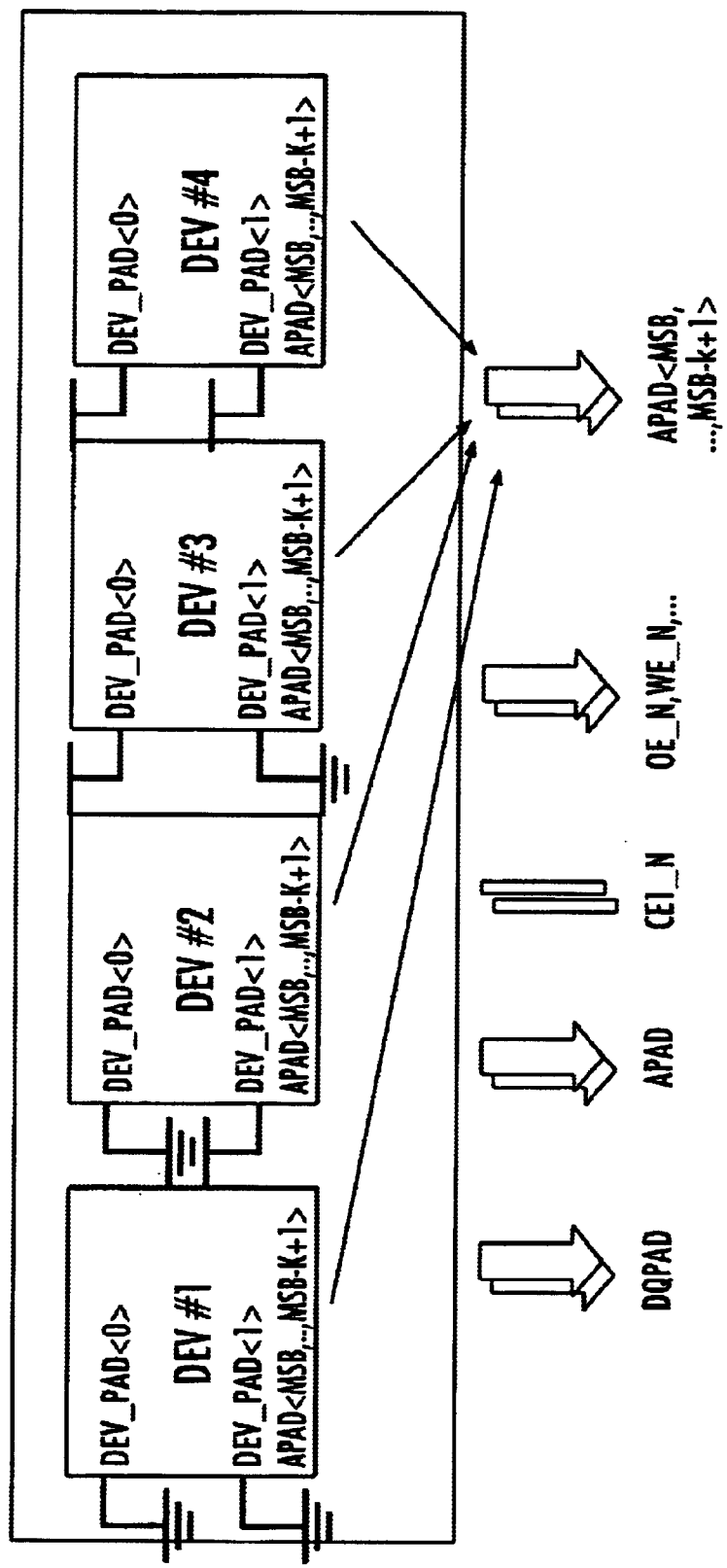
FIG. 4 is a schematic diagram illustrating a stacked device including four distinct memories mounted in a same package according to another embodiment of the present invention.

This approach may be extended also to devices containing even a larger number of memory chips. The case of a memory device realized by mounting inside a single package four memory chips DEV#1, DEV#2, DEV#3 and DEV#4 is schematically depicted in FIG. 4, for instance for constituting a 256 Mbit memory using four memory chips of 64 Mbit each.

In this case each memory chip will be provided with a total of four additional pads in view of the fact that the input/output address bus of the multi-chip device must be incremented of two additional bits (this is dictated by passing from a 64 Mbit memory to a 256 Mbit memory) and in this case two most significant bits <MSB> and <MSB-1> of the external addresses must be used for selecting the memory to which the external address pertains to. The four pairs of additional pads DEV_PAD<1,0> of the four distinct memory chips are logically configured differently from one another, by grounding or connecting both to the supply voltage node or one to the supply voltage node and the other to the ground node or vice versa, according to a scheme of connections such as the one shown in FIG. 4.

In this case, besides the external enable/disable command CE_N, the combinatory logic circuit will receive the logic values corresponding to the hardwired configuration of the two additional pads DEV_PAD<1,0> of each memory and the two most significant bits of the external address that are applied respectively to the corresponding additional input/output pads APAD<MSB,MSB-1> of all four memories, for generating an internal enable/disable command CEN_INT according to the following exemplary truth table.

|       | CEN_N | DEV_PAD<1, 0> | | APAD<MSB, MSB-1> | | CEN_INT |
|-------|-------|---|---|---|---|---------|
| DEV#1 | 0 | 0 | 0 | 0 | 0 | 0 (active) |
|       | 0 | 0 | 0 | 0 | 1 | 1 (standby) |
|       | 0 | 0 | 0 | 1 | 0 | 1 (standby) |
|       | 0 | 0 | 0 | 1 | 1 | 1 (standby) |
| DEV#2 | 0 | 0 | 1 | 0 | 0 | 1 (standby) |
|       | 0 | 0 | 1 | 0 | 1 | 0 (active) |
|       | 0 | 0 | 1 | 1 | 0 | 1 (standby) |
|       | 0 | 0 | 1 | 1 | 1 | 1 (standby) |
| DEV#3 | 0 | 1 | 0 | 0 | 0 | 1 (standby) |
|       | 0 | 1 | 0 | 0 | 1 | 1 (standby) |
|       | 0 | 1 | 0 | 1 | 0 | 0 (active) |
|       | 0 | 1 | 0 | 1 | 1 | 1 (standby) |
| DEV#4 | 0 | 1 | 1 | 0 | 0 | 1 (standby) |
|       | 0 | 1 | 1 | 0 | 1 | 1 (standby) |
|       | 0 | 1 | 1 | 1 | 0 | 1 (standby) |
|       | 0 | 1 | 1 | 1 | 1 | 0 (active) |
|       | 1 | — | — | — | — | 1 (standby) |

Even in this embodiment the composite device will appear to the user like a "stand alone" memory of equivalent capacity. The unique external "chip enable" command CE_N will enable or disable the whole memory device while the first two bit of the address string are exploited for operating a selection among the four memories contained in the device, of the memory to which the addressed memory location pertains, in a way that is not perceived by the user and that is reliably performed by virtue of the fixed biasing of the DEV_PAD nodes (hardwired) by the combinatory logic circuit that is purposely realized on each of the four memory chips that compose the device. The stated objectives and advantages are attained by the architecture of this invention.

What is claimed is:

1. A memory device comprising:
    a plurality of memory chips assembled in a package and sharing input/output pins, the memory chips being singularly enabled by external commands; and
    a single dedicated pin to receive an external enable/disable logic command;
    each of the memory chips including
        a plurality of primary input/output pads connected to the shared input/output pins,
        a plurality of secondary input/output pads equal to 2*n, where $2^n$ is the number of memory chips of the device, and
        a command circuit to generate an internal enable/disable command based upon logic inputs on the secondary pads and the external enable/disable logic command.

2. The memory device according to claim 1, wherein at least one of the plurality of secondary input/output pads of each memory chip is hardwired biased in a coordinated fixed logic state to distinguish each memory chip from the other (s), the other secondary input/output pad(s) are connected to receive at least one most significant bit from an external address bus.

3. The memory device according to claim 2, wherein each command circuit comprises input buffers coupled to the respective secondary input/output pads of the memory chip and a combinatory logic circuit to receive output signals of the buffers and the external enable/disable command for selecting the memory chip to which an addressed memory location pertains based upon the at least one most significant bit of the external address bus and the coordinated fixed logic states of the respective secondary input/output pads of the different memory chips.

4. A memory device comprising:
    a plurality of memory chips assembled in a package that includes a single dedicated pin to receive an external enable/disable logic command for the plurality of memory chips;
    each of the memory chips including a command circuit, having a plurality of secondary input/output pads, to generate an internal enable/disable command based upon signals received at the secondary input/output pads and the external enable/disable logic command received at the single dedicated pin.

5. The memory device according to claim 4 wherein the plurality of secondary input/output pads comprise 2*n secondary input/output pads, where $2^n$ is the number of memory chips of the device.

6. The memory device according to claim 4, wherein at least one of the secondary input/output pads of each memory chip is hardwired biased in a coordinated fixed logic state to distinguish each memory chip from the other(s).

7. The memory device according to claim 6, wherein the other secondary input/output pad(s) are connected to receive at least one most significant bit from an external address bus.

8. The memory device according to claim 7, wherein each command circuit comprises input buffers coupled to the respective secondary input/output pads of the memory chip and a combinatory logic circuit to receive output signals of the buffers and the external enable/disable command for selecting the memory chip to which an addressed memory location pertains based upon the at least one most significant bit of the external address bus and the coordinated fixed logic states of the respective secondary input/output pads of the different memory chips.

9. A method of making a memory device comprising:
    packaging a plurality of memory chips in a package that includes a single dedicated pin to receive an external enable/disable logic command for the plurality of memory chips;
    providing each of the memory chips with a command circuit, having a plurality of secondary input/output pads, to generate an internal enable/disable command based upon signals received at the secondary input/output pads and the external enable/disable logic command received at the single dedicated pin.

10. The method according to claim 9 wherein the plurality of secondary input/output pads comprise 2*n secondary input/output pads, where $2^n$ is the number of memory chips of the device.

11. The method according to claim 9, wherein at least one of the secondary input/output pads of each memory chip is hardwired biased in a coordinated fixed logic state to distinguish each memory chip from the other(s).

12. The method according to claim 11, wherein the other secondary input/output pad(s) are connected to receive at least one most significant bit from an external address bus.

13. The method according to claim 12, wherein each command circuit comprises input buffers coupled to the respective secondary input/output pads of the memory chip and a combinatory logic circuit to receive output signals of the buffers and the external enable/disable command for selecting the memory chip to which an addressed memory location pertains based upon the at least one most significant bit of the external address bus and the coordinated fixed logic states of the respective secondary input/output pads of the different memory chips.

* * * * *